United States Patent [19]
Park et al.

[11] Patent Number: 5,568,445
[45] Date of Patent: Oct. 22, 1996

[54] SYNCHRONOUS SEMICONDUCTOR MEMORY DEVICE WITH A WRITE LATENCY CONTROL FUNCTION

[75] Inventors: Churoo Park, Suwon; Si-Yeol Lee, Yongin-gun; Ho-Cheol Lee; Hyun-Soon Jang, both of Seoul, all of Rep. of Korea

[73] Assignee: Samsung Electronics Co., Ltd., Suwon, Rep. of Korea

[21] Appl. No.: 397,690

[22] Filed: Mar. 2, 1995

[30] Foreign Application Priority Data

Mar. 3, 1994 [KR] Rep. of Korea .................... 4127/1994

[51] Int. Cl.$^6$ ........................................ G11C 8/00
[52] U.S. Cl. .................................... 365/233; 365/194
[58] Field of Search .................... 365/233, 236, 365/194, 191, 225.7

[56] References Cited

U.S. PATENT DOCUMENTS 4,953,128  8/1990  Kawai ........................ 365/194
5,268,865  12/1993  Takasugi ..................... 365/233
5,386,385  1/1995  Stephens ..................... 365/195
5,444,667  8/1995  Obara ........................ 365/233

*Primary Examiner*—David C. Nelms
*Assistant Examiner*—Son Mai
*Attorney, Agent, or Firm*—Cushman Darby & Cushman, L.L.P.

[57] ABSTRACT

A semiconductor memory device for processing data in synchronization with a system clock applied from the exterior includes a circuit for generating a write latency control signal, a circuit for generating one active information enlarged signal from a plurality of active information signals generated in response to a column related control signal supplied from the exterior, and a circuit for holding internal operations of a column address counter, a burst length counter and a data transfer switching circuit for a prescribed time in which the active information enlarged signal is in an active state.

17 Claims, 14 Drawing Sheets

SYNCHRONOUS SEMICONDUCTOR MEMORY DEVICE WITH A WRITE LATENCY CONTROL FUNCTION

BACKGROUND OF THE INVENTION

The present invention relates to synchronous semiconductor memory devices, and more particularly to an apparatus for adjusting a write latency of a synchronous semiconductor memory device.

Unlike a standard dynamic RAM (random access memory), a synchronous dynamic RAM can internally generate a column address (refer to a video RAM). In the standard dynamic RAM, since one column address must be supplied in order to read or write one data signal, there are needed n column addresses to read or write n data signals. Even if successive column addresses are used, this also applies (refer to a fast page mode and a static column mode). In the synchronous dynamic RAM, if only an initial column address is applied, the successive column addresses are internally generated, thereby reading or writing n data signals. Therefore, there is no need to externally supply all the column addresses. In the following specification, a counter referred to as a column address counter is used to determine the successive column addresses.

The number n of data signals which are capable of reading or writing after the initial column address is applied is referred to as a burst length or a wrap size. The burst length is not a fixed value but variable values varying with an address value received at when a mode reset signal (MRS) register is set, and these values are stored in an internal store register until the next MRS is set. Hence, the synchronous dynamic RAM stores data for controlling an internal circuit as well as data stored in a memory cell.

Unlike the standard dynamic RAM, the synchronous dynamic RAM uses the same clock in activating a column address strobe signal $\overline{CAS}$ and in receiving a column address. Latency represents the number of clock cycles that occurred of a system clock prior to data being generated or received since receipt of an initial column address, and this latency is counted by a clock unit. The latency in generating the data is referred to as a $\overline{CAS}$ latency or read latency, and the latency in receiving the data is referred to as a write latency. The $\overline{CAS}$ latency as well as the burst length is determined by the MRS. Generally, the write latency is fixed at any value.

In the synchronous dynamic RAM, since data signals corresponding to the burst length should be generated or received after the burst length is programmed to the MRS, it is necessary to detect when to internally stop data input/output. This is performed by comparing a counted clock with a value programmed to the MRS and stored in the register. A counter serving this purpose is referred to as a burst end counter.

In the synchronous memory device operated in synchronization with a frequency of the system clock externally applied, a write latency value depends on whether the data is received after how many clocks from the applied system clock. The memory device has been designed by fixing the write latency at one value. In order to meet a variety of user's demands for the write latency, to use complicated additional circuits may be undesirable on the part of the seller. Therefore, it is necessary to variably adjust the write latency to satisfy both the user and the seller.

SUMMARY OF THE INVENTION

It is an object of the invention to provide a synchronous semiconductor memory device which is capable of controlling a write latency.

In accordance with one aspect of the invention, a semiconductor memory device for processing data in synchronization with a system clock applied from the exterior includes a circuit for generating a write latency control signal, a circuit for generating one active information enlarged signal from a plurality of active information signals generated in response to a column related control signal supplied from the exterior, and a circuit for holding internal operations of a column address counter, a burst length counter and a data transfer switching circuit for a prescribed time in which the active information enlarged signal is in an active state.

BRIEF DESCRIPTION OF THE INVENTION

DETAILED DESCRIPTION OF THE PREFERRED EMBODIMENT

Figure 1:
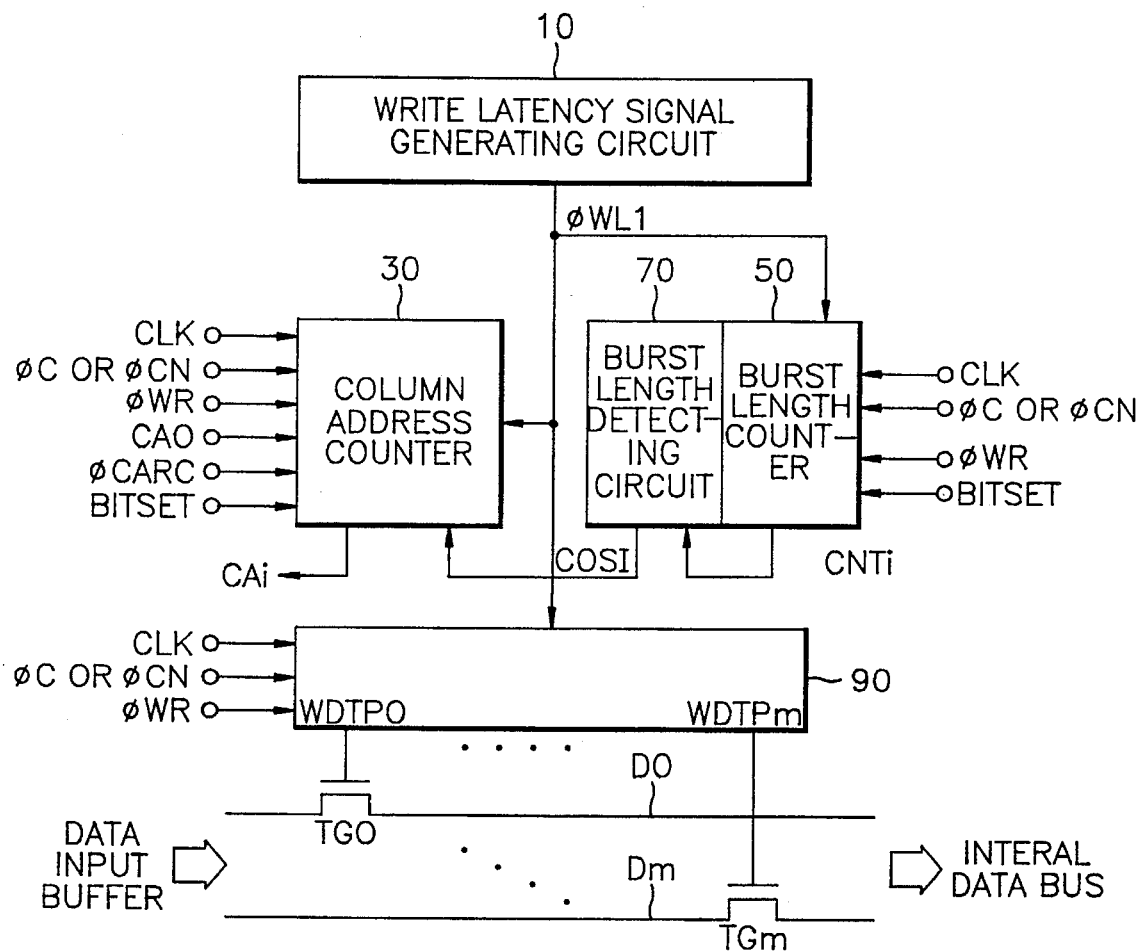
FIG. 1 is a block diagram showing a basic configuration for controlling a write latency according to the present invention.

The preferred embodiment of the invention is applied to the synchronous dynamic RAM of a mega-bit class. FIG. 1 shows constituents contained to implement a write latency control function in a semiconductor memory device. A write latency signal generating circuit 10 generates a write latency signal $\phi WL1$ determining a write latency value. The write latency signal $\phi WL1$ can set the write latency value "0" or "1" and the generating process thereof is shown in FIG. 2. A column address counter 30 receives a system clock CLK, a $\overline{CAS}$ active information signal φC (or $\overline{CAS}$ active information enlarged signal φCN when the write latency value is "n"), a write enable ($\overline{WE}$) active information signal φWR, a column address signal CA0, a column address reset signal φCARC, a bit set signal BITSET and the write latency signal φWL1, and transmits to a column address buffer a plurality of column address signals counted from the column address signal CA0. A burst length counter 50 receives the system clock CLK, $\overline{CAS}$ active information signal φC (or $\overline{CAS}$ active information enlarged signal φCN when the write latency value is "n"), $\overline{WE}$ active information signal φWR, bit set signal BITSET and write latency signal φWL1, and supplies a burst length counting signal CNTi (where i is one of 0–8) to a burst length detecting circuit 70. The burst length detecting circuit 70 compares the burst length counting signal CNTi generated from the burst length counter 50 with a prescribed burst length signal to generate a burst length sensing signal COSI and transmits the burst length sensing signal COSI to the column address counter 30 to control a counting operation of the column address signals. A data transfer switching circuit 90 receives the system clock CLK, $\overline{CAS}$ active information signal φC (or $\overline{CAS}$ active information enlarged signal φCN when the write latency value is "n"), $\overline{WE}$ active information signal φWR the write latency signal φWL1, and generates data transfer switching signals WDTP0–WDTPm for controlling data transfer gates TG0–TGm.

The system clock CLK is supplied from a microprocessor etc. external of the memory drive chip and has a constant frequency of 100 MHz, 66 MHz or 33 MHz for example. The system clock CLK is used as a basis for setting a variety of operation timings in the synchronous semiconductor memory device. The $\overline{CAS}$ active information signal φC is generated from a $\overline{CAS}$ buffer (not shown) receiving a column address strobe signal $\overline{CAS}$ supplied from the exterior of the chip. The $\overline{CAS}$ active information signal is activated in response to the column address strobe signal $\overline{CAS}$ activated to logic "low" and maintained at logic "high" during one cycle. The $\overline{CAS}$ active information enlarged signal φCN is generated by delaying the $\overline{CAS}$ active information signal φC by the number of clocks of the system clock CLK corresponding to the set write latency value and the generating process thereof will be described with reference to FIG. 3. The $\overline{WE}$ active information signal φWR is generated from a $\overline{WE}$ buffer (not shown) receiving a write enable signal $\overline{WE}$ supplied from the exterior of the chip and activated in response to the write enable signal $\overline{WE}$ activated to logic "low". The $\overline{WE}$ active information signal φWR is maintained at logic "low" only when the initial column address signal is supplied and maintained at logic "high" during a write cycle. The column address reset signal φCARC is activated, together with the bit set signal BITSET, in response to the $\overline{CAS}$ active information signal φC generated from the $\overline{CAS}$ buffer and maintained at logic "high" during the write cycle. The bit set signal BITSET is a pulse signal activated to logic "high" only when the initial column address signal is supplied in response to the $\overline{CAS}$ active information signal φC, in order to control the column address counter 30 and burst length counter 50. Other details of these signals will be readily appreciated from the following description.

Figure 2A:
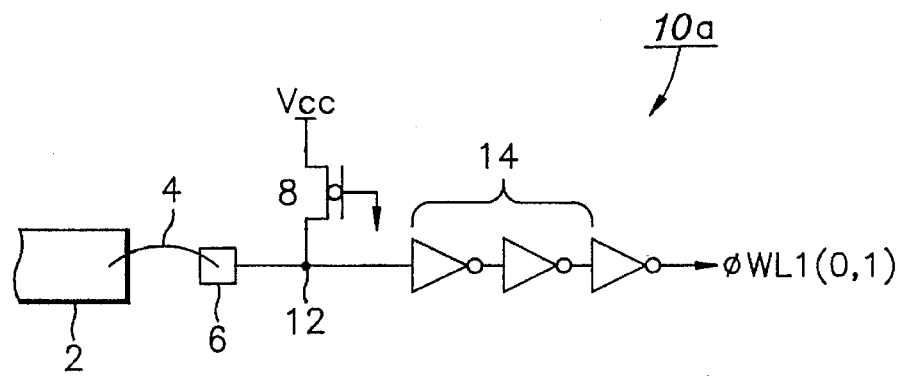
FIGS. 2A–2C illustrate a write latency signal generating circuit of FIG. 1 using a bonding wire, a fuse, and a program form by a column address and a WCBR mode signal, respectively.
Figure 2B:
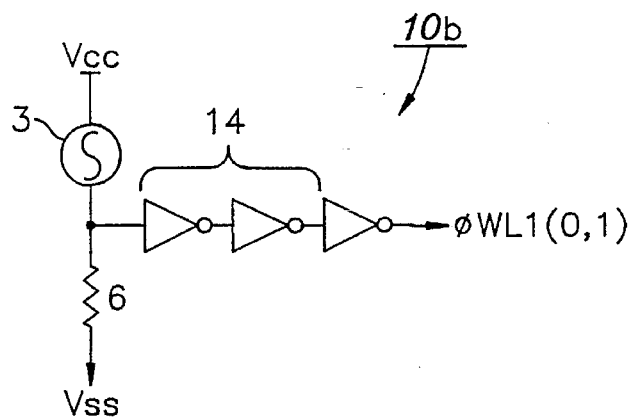
Figure 2C:
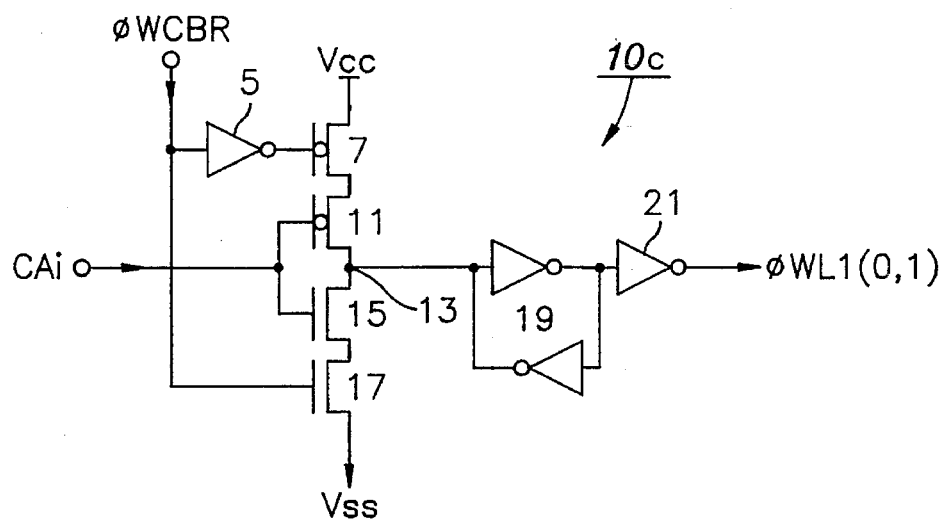

Examples of the write latency signal generating circuit 10 of FIG. 1 are illustrated in FIGS. 2A–2C. In FIG. 2A, a bonding wire 4 is used between a ground voltage pin 2 and a pad 6 in a chip bonding process. If the bonding wire 4 is coupled to the ground voltage pin 2, a signal of logic "low" is applied to an inverter chain 14 and the write latency signal φWL1 of logic "high" is generated. In such instance, the write latency value is "1" and this means that input data is transferred to an internal data bus after one clock of the system clock CLK from a supply of the write enable signal $\overline{WE}$. If the pad 6 is not connected to the ground voltage pin 2, a potential of a node 12 is set to logic "high" through a PMOS transistor 8 and the write latency signal φWL1 of logic "low" is generated. Then the write latency is "0" and this means that the synchronous dynamic RAM does not perform the write latency operation.

In FIG. 2B, a fuse 3 is used in a latency test process. If the fuse 3 is connected to a power voltage Vcc, the write latency signal φWL1 of logic "low" (in this case, the write latency value is "0") is generated through the inverter chain 14. If the fuse 3 is disconnected from the power voltage Vcc, the write latency signal φWL1 of logic "high" (in this case, the write latency value is "1") is generated. In FIG. 2C, there is used a program form which is controlled by a WCBR clock φWCBR and generates the write latency signal φWL1 in response to a logic state of any column address signal CAi. If the WCBR clock φWCBR is set to logic "high", an inverter consisting of a PMOS transistor 11 and an NMOS transistor 15 is operable. The input of the inverter is the column address signal CAi and the output of the inverter is supplied to a latch 19. The output of the latch 19 is supplied through an inverter 21 to a NAND gate (not shown). If the column address signal CAi is logic "low", the write latency signal φWLi of logic "low" (in this instance, the write latency value is "0") is generated, and if the column address signal CAi is logic "high", the write latency signal φWLi of logic "high" (in this case, the write latency value is "1") is generated.

Figure 3:
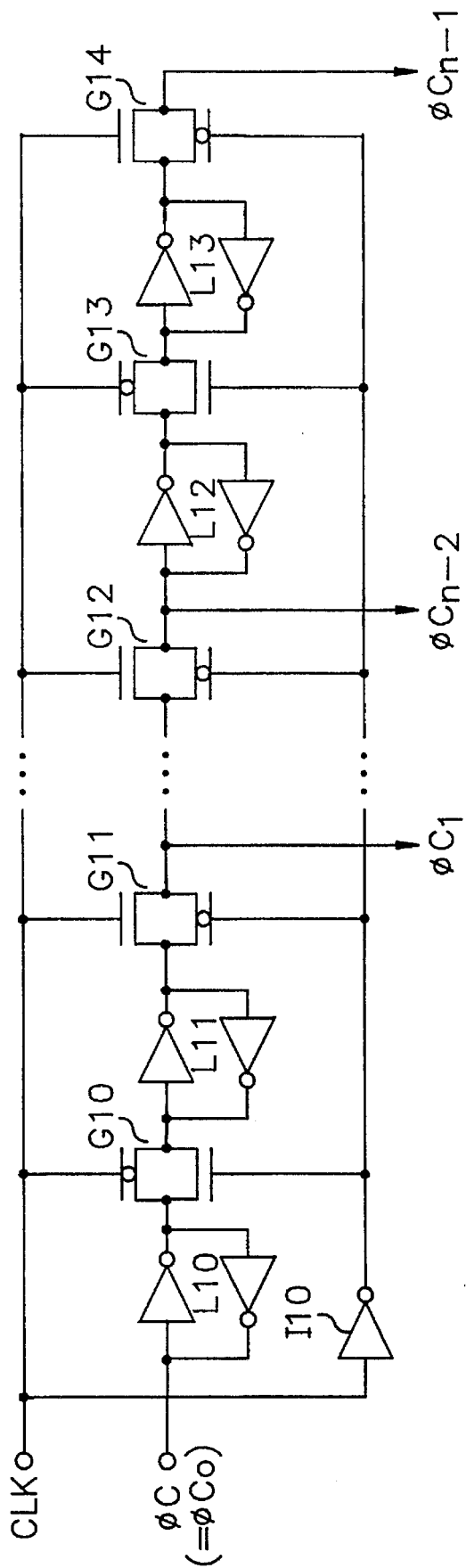
FIG. 3 illustrates a circuit for generating a $\overline{CAS}$ active information enlarged signal $\phi CN$ supplied when a write latency value is set to "n"
Figure 3:
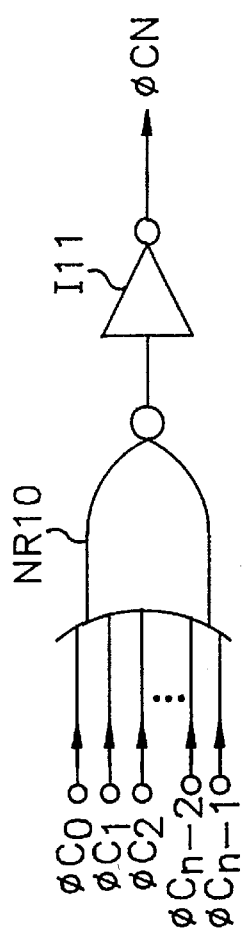

To set the write latency value to "n" which is equal to or greater than "2", there is needed a circuit for generating the $\overline{CAS}$ active information enlarged signal φCN as shown in FIG. 3. To generate n $\overline{CAS}$ active information signals φC0-φCn-1, the $\overline{CAS}$ active information signal φC is supplied to a shift register consisting of latches L10, L11, . . . , L12, L13 and transfer gates G10, G11, . . . , G12, G13, G14. The transfer gates operate in a CMOS mode. The N-type and P-type electrodes of the adjacent transfer gates are oppositely placed and controlled by the system clock CLK. The n $\overline{CAS}$ active information signals φC0-φCn-1 generated through the shift register are supplied to a NOR gate NR10. The output of the NOR gate NR10 is supplied to an inverter I11 to generate the $\overline{CAS}$ active information enlarged signal φCN having information on the n $\overline{CAS}$ active information signals. If the $\overline{CAS}$ active information enlarged signal φCN is used, the input data is transferred to the internal data bus in response to an n-th system clock CLK after the write enable signal is activated.

Figure 4A:
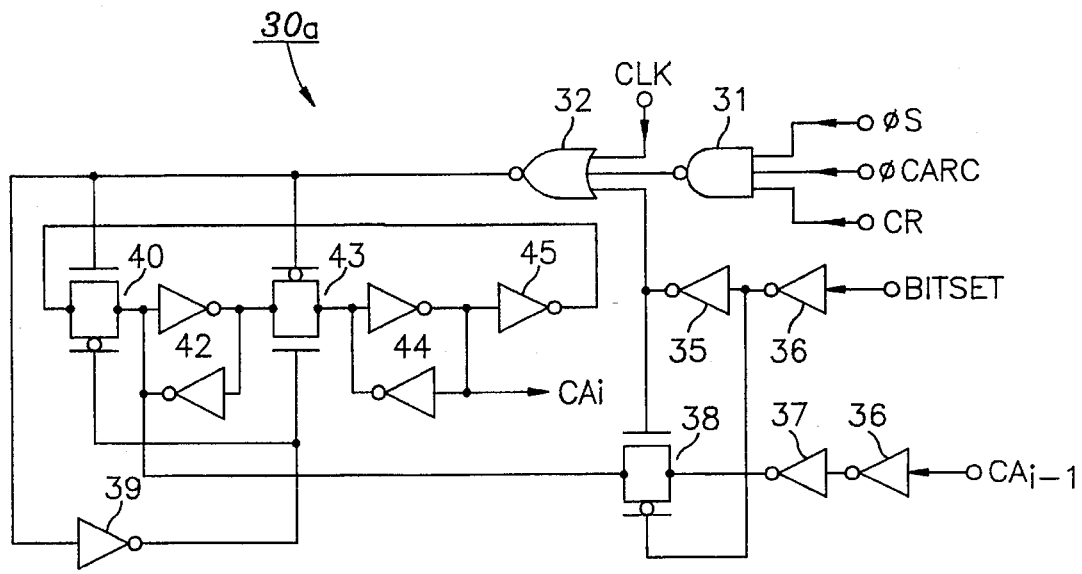
FIGS. 4A and 4B illustrate a column address counter of FIG. 1 when write latency information is not considered and when the write latency information is considered, respectively.
Figure 4B:
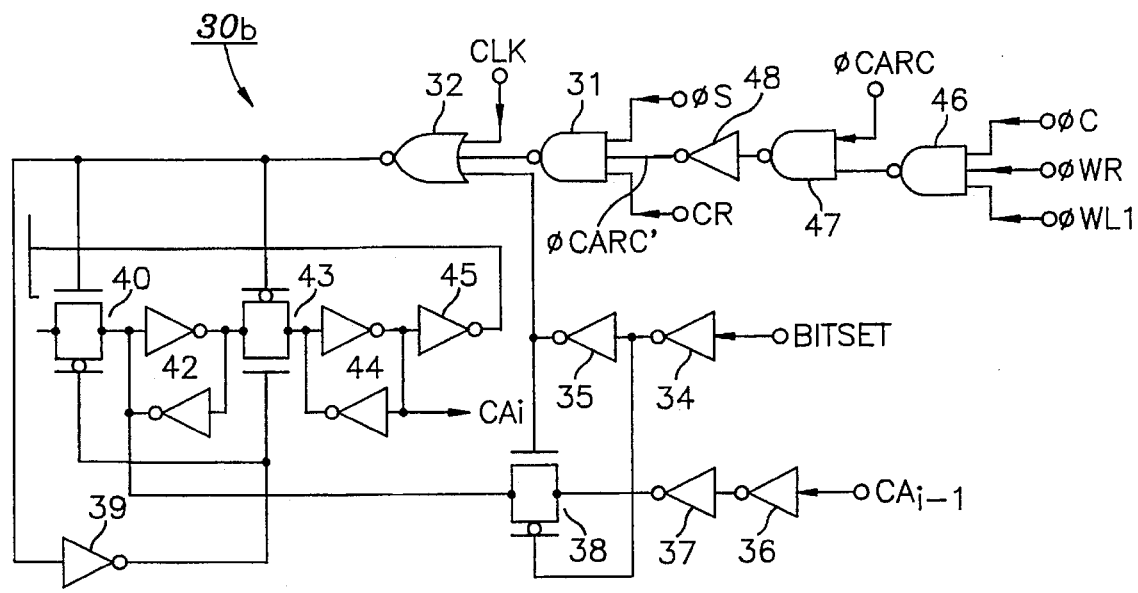

FIGS. 4A and 4B show one count stage of the column address counter 30 of FIG. 1. A column address signal CAi-1 and a carry signal CRi-1 generated from the preceding stage are supplied to generate a counted column address signal CAi. Although not shown in the drawing, the circuit configuration of each count stage of the general column address counter used in the synchronous semiconductor memory device is the same as that of FIGS. 4A and 4B except that the column address signal and carry signal are supplied from the preceding stage. The common circuit configuration shown in FIGS. 4A and 4B is well known in the art. While FIG. 4A illustrates the column address counter when the write latency value is "0", in FIG. 4B, the write latency information is considered in generating the column address signal. Referring to FIG. 4B, the output of a NAND gate 46 receiving the $\overline{CAS}$ active information signal φC (or $\overline{CAS}$ active information enlarged signal φCN when the write latency value is set to "n"), $\overline{WE}$ active information signal φWR and write latency signal φWL1 is supplied to a NAND gate 47, together with the column address reset signal φCARC. The output of the NAND gate 47 is supplied through an inverter 48 to a NAND gate 31. Therefore, the column address reset signal φCARC' generated through the inverter 48 has the write latency information. It should be noted that FIG. 4B considers the write latency information in the column address counting operation according to the present invention.

Figure 5A:
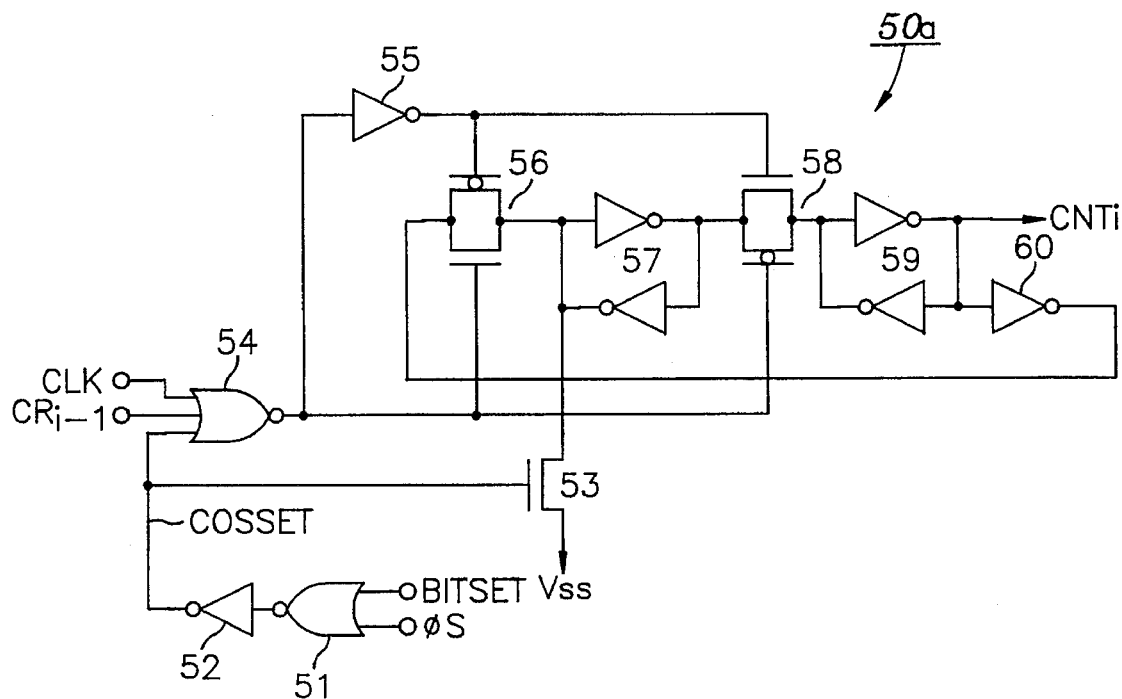
FIGS. 5A and 5B illustrate a burst length counter of FIG. 1 when the write latency information is not considered and when the write latency information is considered, respectively.
Figure 5B:
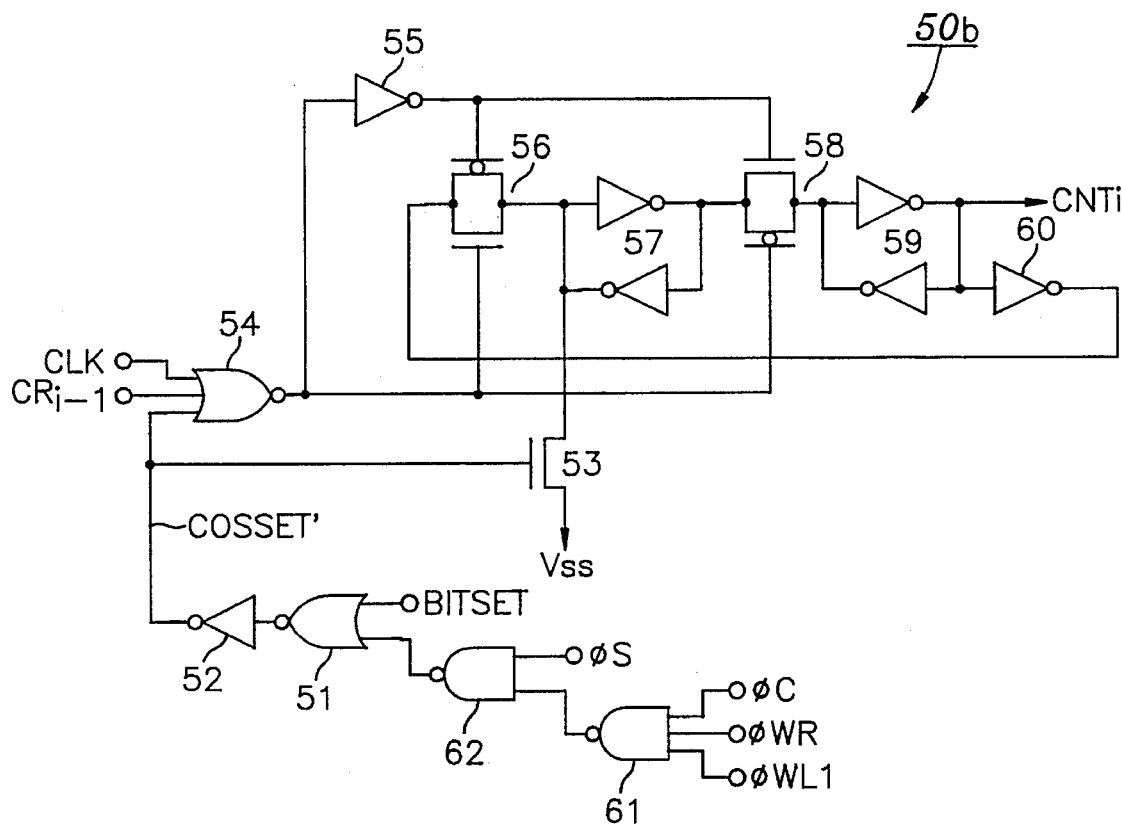

FIGS. 5A and 5B show the burst length counter 50 of FIG. 1, and a burst length counting signal CNTi (where i is one of 0–8) is generated. FIG. 5A illustrates the burst length counter when the write latency information is not considered or when the write latency value is "0", and FIG. 5B illustrates the burst length counter when the write latency information is considered. In FIG. 5A, a NOR gate 51 receiving the bit set signal BITSET and reset signal φS generates through an inverter 52 a signal COSSET for controlling the burst length counting operation. The burst length counting control signal COSSET is supplied to a NOR gate 54. The NOR gate 54 is controlled by the system clock CLK and receives a carry signal CRi-1 generated from the preceding stage. The output of the NOR gate 54 controls CMOS transfer gates 56 and 58. A latch 57 is connected between the output of the transfer gate 56 and the input of the transfer gate 58. The output of the inverter 52 is connected to the gate of an NMOS transistor 53 connected between the input of the latch 57 and a substrate voltage Vss. A latch 59 and an inverter 60 are serially connected between the output of the transfer gate 58 and the input of the transfer gate 56. The burst length counting signal CNTi is generated from the latch 59.

In FIG. 5B, the write latency signal φWL1 is applied to a NAND gate 61 controlled by the $\overline{CAS}$ active information signal φC (or $\overline{CAS}$ active information enlarged signal φCN when the write latency value is set to "n") and $\overline{WE}$ active information signal φWR. The output of the NAND gate 61 is supplied to the NAND gate 62 controlled by the reset signal φS, and the output of the NAND gate 62 is supplied to the NOR gate 51 controlled by the bit set signal BITSET. Hence, the burst length counting control signal COSSET' generated through the inverter 52 has the write latency information. Additional circuit configuration for generating the burst length counting signal CNTi is the same as that of FIG. 5A.

Figure 6:
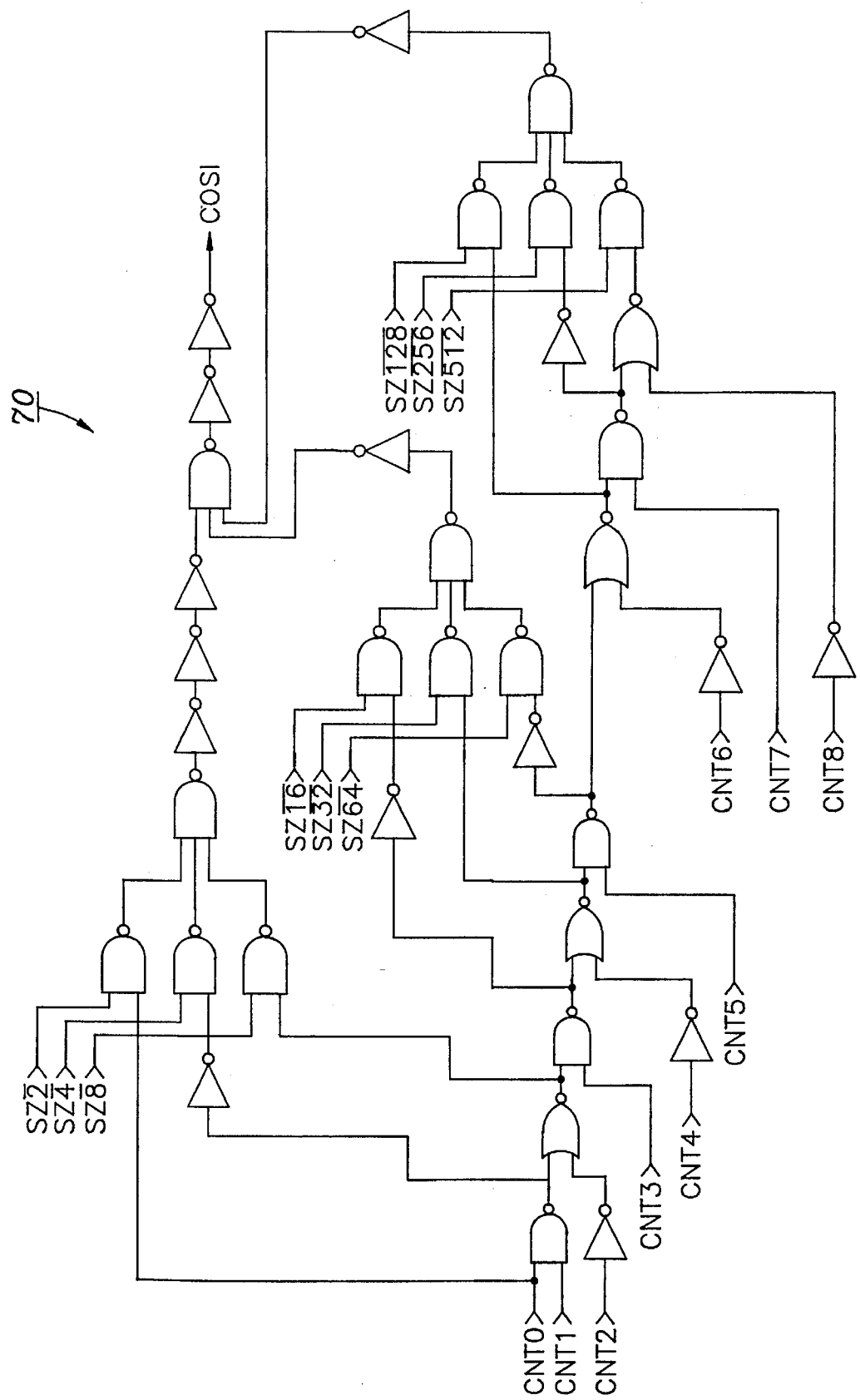
FIG. 6 illustrates a burst length detecting circuit of FIG. 1.

The burst length detecting circuit 70 of FIG. 1 is shown in FIG. 6. The burst length detecting circuit receives the burst length counting signals CNT0–CNT8 generated from the burst length counter having each count stage shown in FIG. 5A or 5B and generates a burst length detecting signal COSI for detecting whether the burst length is completed. The burst length detecting signal COSI is obtained by comparing the burst length counting signals CNT0–CNT8 with prescribed burst length signals $SZ\overline{2},SZ\overline{4},SZ\overline{8}$, $SZ\overline{16},SZ\overline{32},SZ\overline{64},SZ\overline{128},SZ\overline{256}$ and $SZ\overline{512}$ produced from an operation mode setting circuit (not shown). The circuit of FIG. 6 is disclosed in KOREA Patent No. 93-7127, assigned to the same assignee as the present invention. It should be noted that the write latency information is considered in detecting the burst length.

Figure 7A:
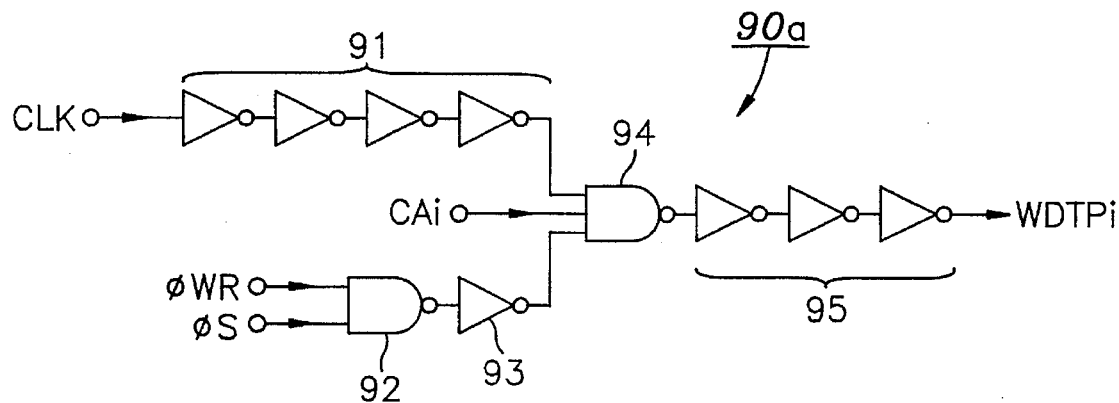
FIGS. 7A and 7B illustrate a data transfer switching circuit of FIG. 1 when the write latency information is not considered and when the write latency information is considered, respectively.
Figure 7B:
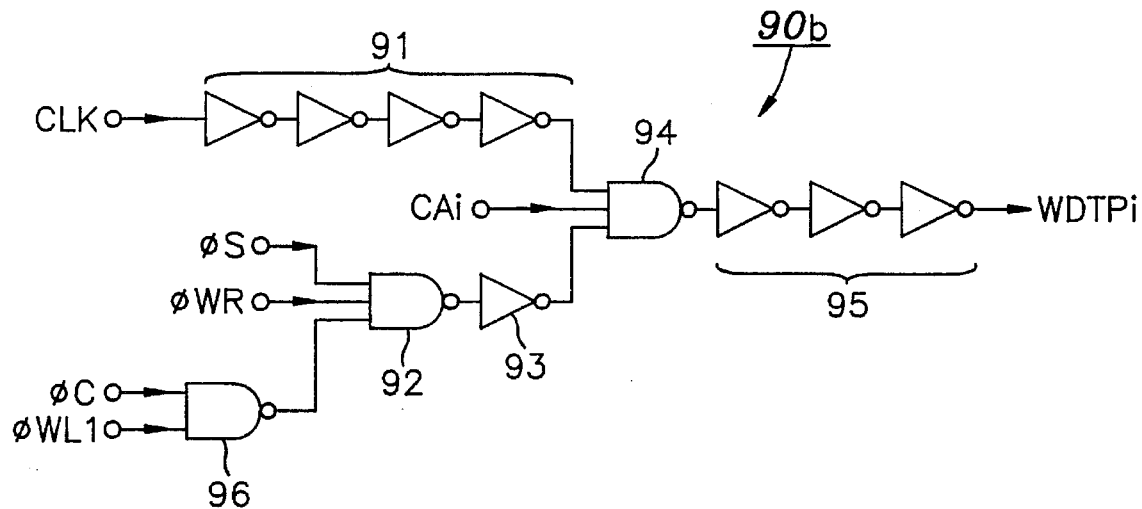

The data transfer switching circuit 90 of FIG. 1 indicated in FIGS. 7A and 7B generates the data transfer switching signal WDTPi (where i is one of 0-m) controlling one of the data transfer gates TG0–TGm of FIG. 1. FIG. 7A illustrates the data transfer switching circuit when the write latency information is not considered, and FIG. 7B illustrates the data transfer switching circuit when the write latency information is considered. In FIG. 7A, the system clock CLK is supplied to a NAND gate 94 through an inverter chain 91 consisting of four inverters. The output of a NAND gate 92 receiving the $\overline{WE}$ active information signal φWR and reset signal φS is also supplied to the NAND gate 94 via an inverter 93 and the column address signal CAi is also supplied to the NAND gate 94. The NAND gate 94 generates the data transfer switching signal WDTPi via an inverter chain 95 consisting of three inverters. Although the data transfer switching circuit of FIG. 7A generates one data switching transfer signal with respect to one column address signal, the number of column address signals should be the same as the number of NAND gates 94 and the number of inverter chains 95, respectively. The configuration of FIG. 7B is the same as that of FIG. 7A except that the output of a NAND gate 96 receiving the $\overline{CAS}$ active information signal φC (or $\overline{CAS}$ active information enlarged signal φCN when the write latency value is "n") and write latency signal φWL1 is further supplied to the NAND gate 92 controlled by the $\overline{WE}$ active information signal φWR and reset signal φS.

The write latency control operation of the present invention configurated in the above-mentioned way will now be described. The write latency signal φWL1 generated from the write latency signal generating circuit 10, as indicated in FIG. 1, should be simultaneously supplied to the column address counter 30, burst length counter 50 and data transfer switching circuit 90 to completely implement time control from the start of a write cycle by the column address strobe signal $\overline{CAS}$ and write enable signal $\overline{WE}$ until write data is conveyed from the data input buffer to the internal data bus after passing the data transfer gate. To this, a signal with the write latency information holds a logic gating operation at the column address counter 30, burst length counter 50 and data transfer switching circuit 90, as appreciated from FIGS. 4B, 5B and 7B.

Assuming that the write latency value is "n", the write latency signal φWL1 and $\overline{CAS}$ active information enlarged signal φCN which are logic "high" are supplied to the NAND gate 46 of the column address counter of FIG. 4B. During the write cycle, since the $\overline{WE}$ active information signal φWR is in logic "high", the output of the NAND gate 46 is logic "low". The output of the NOR gate 32 controlled by the system clock CLK is maintained at logic "low" while the $\overline{CAS}$ active information enlarged signal φCN is maintained at logic "high" (this time is referred to as a "holding time" and indicated in the drawing by "TH") under the logic "high" state of the write latency signal φWL1. Since the transfer gate 40 is turned off and the transfer gate 43 is turned on during such a holding time, the column address signal CAi is maintained at a current logic state during the holding time.

Similarly, if the write latency value is "n", since the output of the NAND gate 61 of the burst length counter of FIG. 5B is logic "low" during the holding time, the output of the NOR gate 54 controlled by the system clock CLK is maintained at logic "low" during the holding time. The transfer gate 56 is turned off and the transfer gate 58 is turned on, thereby maintaining the burst length counting signal CNTi at the current logic state during the holding time. In the data transfer switching circuit of FIG. 7B, if the write latency value is "n", since the output of the NAND gate 96 receiving the write latency signal φWL1 and $\overline{CAS}$ active information enlarged signal φCN is logic "low" during the holding time, the output of the NAND gate 94 receiving the column address signal CAi is maintained at logic "high" during the holding time. Since the data transfer switching signal WDTPi is maintained at logic "low" during this holding time, the corresponding data transfer gate shown in FIG. 1 is not turned on.

Consequently, the column address counter, burst length counter and data transfer switching circuit generate outputs unchanged from the current logic state during the holding time. The holding time is determined by the $\overline{CAS}$ active information signal and write latency signal having the write latency information.

Figure 8A:
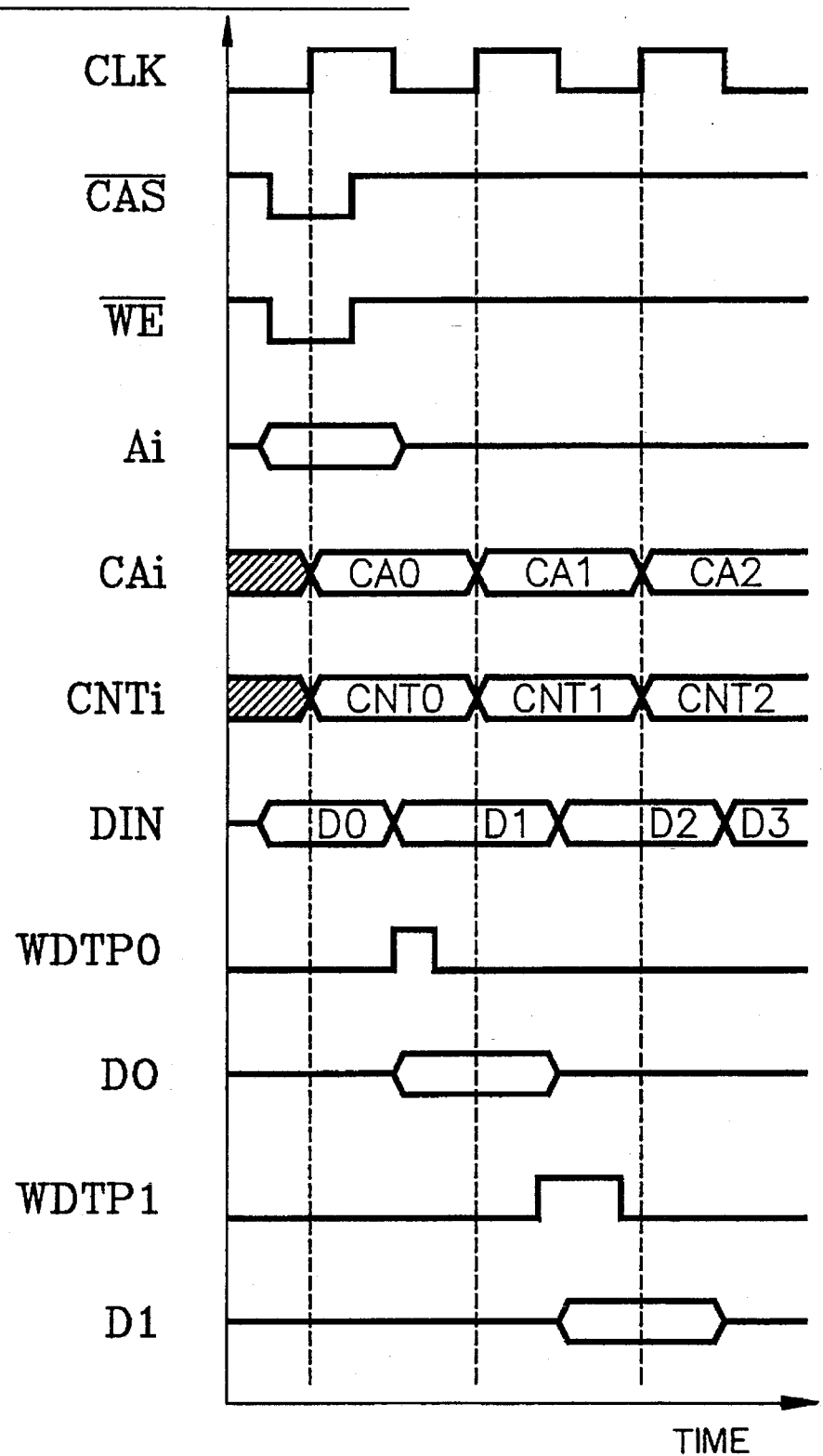
FIGS. 8A–8C are timing charts illustrating the operation of FIG. 1 when the data transfer switching circuit is not controlled by the write latency information, and when a write latency value is "0", "1" and "2", respectively.
Figure 8B:
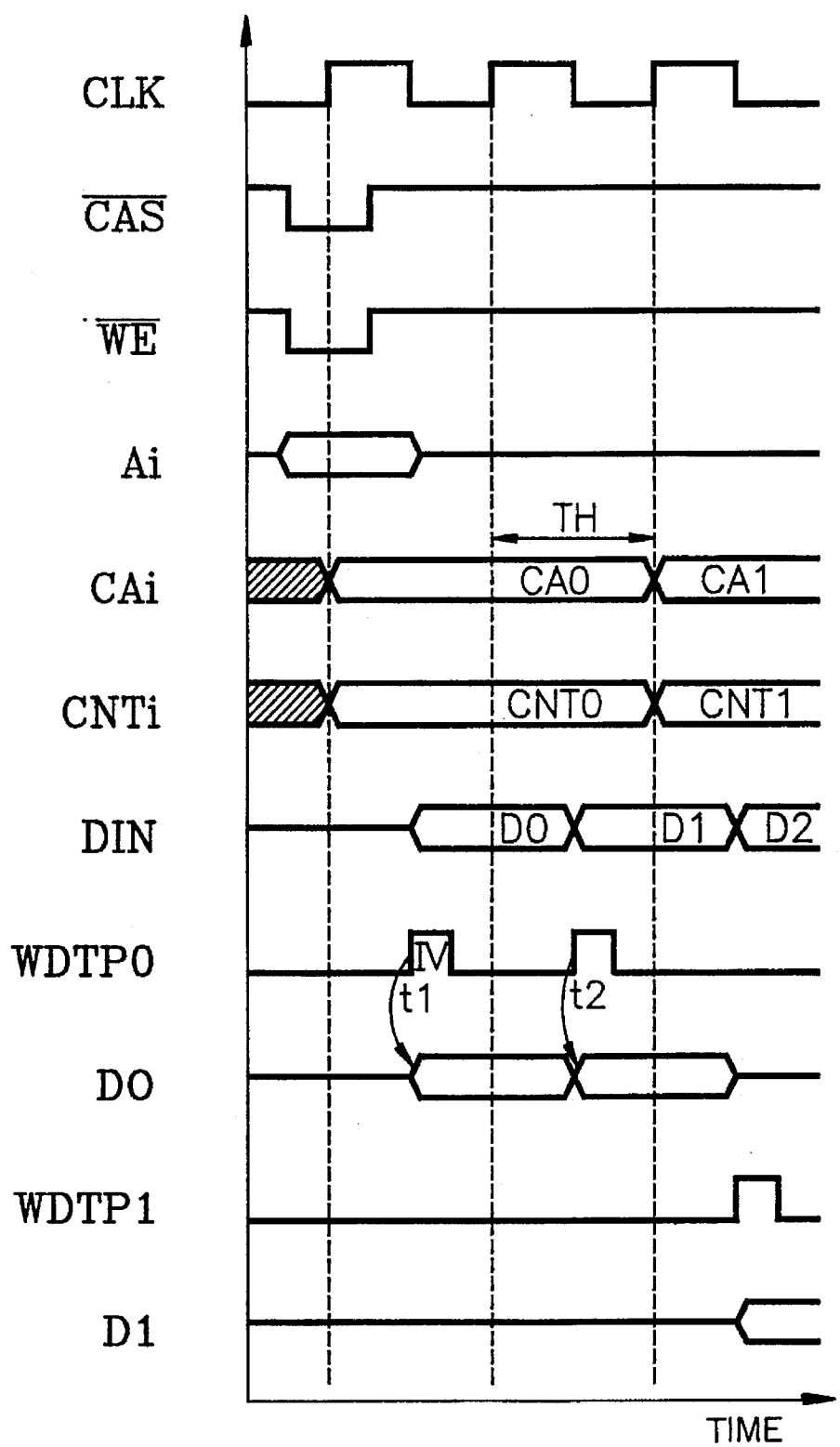
Figure 8C:
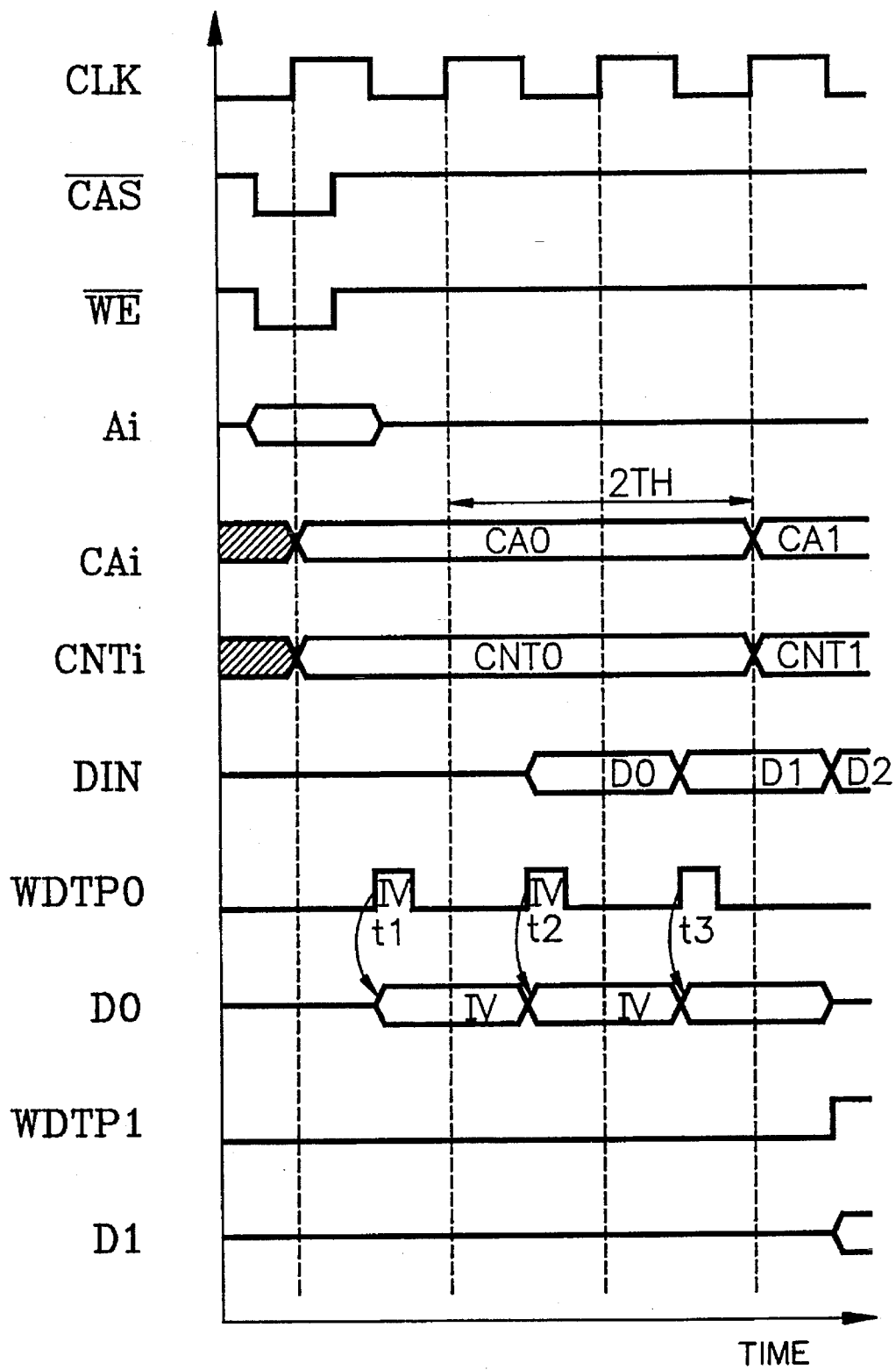

FIGS. 8A–8C illustrate timing charts when only the data transfer switching circuit 90 of FIG. 1 is not controlled by the write latency information. In FIG. 8A, the write latency value is "0", and input data D1 and D2 are normally accessed in response to the data transfer switching signals WDTP1 and WDTP2, respectively. Meanwhile, when the write latency value is "1" and "2", as shown in FIGS. 8B and 8C respectively, since the column address signal CAi is not counted and maintained at the current state during the holding time TH of FIG. 8B and twice the holding time 2TH of FIG. 8C, an invalid data transfer switching signal WDTP1 (indicated by "IV") is generated (at a time t1 of FIG. 8B and at t1 and t2 of FIG. 8C) every clock of the system clock CLK. Therefore, a malfunction in which the invalid input data D1 is transferred to the internal data bus through the data transfer gate TG1 occurs.

Figure 9:
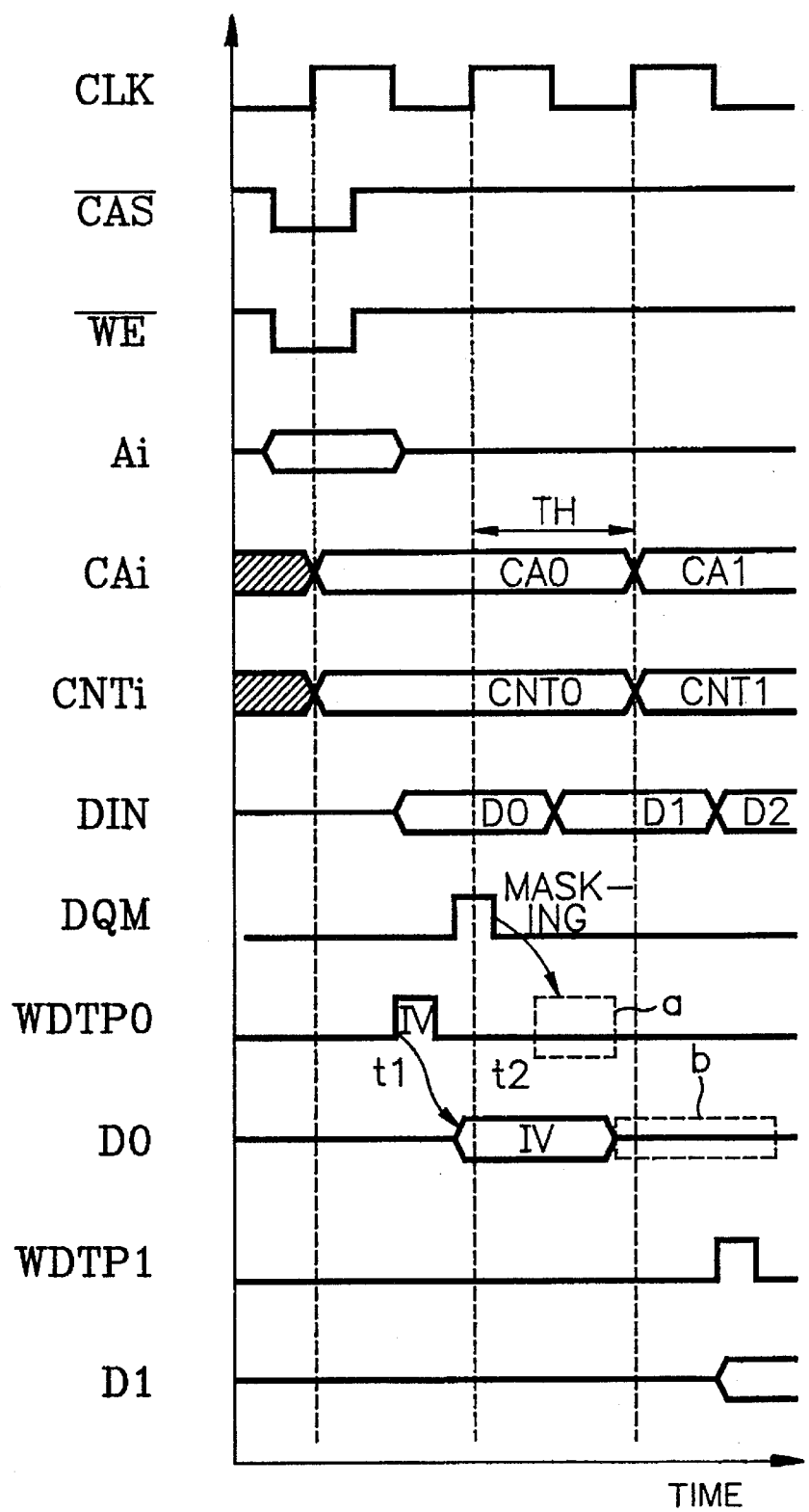
FIG. 9 is a timing chart illustrating the operation of FIG. 1 when an input/output masking operation is performed under the state that the data transfer switching circuit is not controlled and the write latency value is "1"
Figure 10:
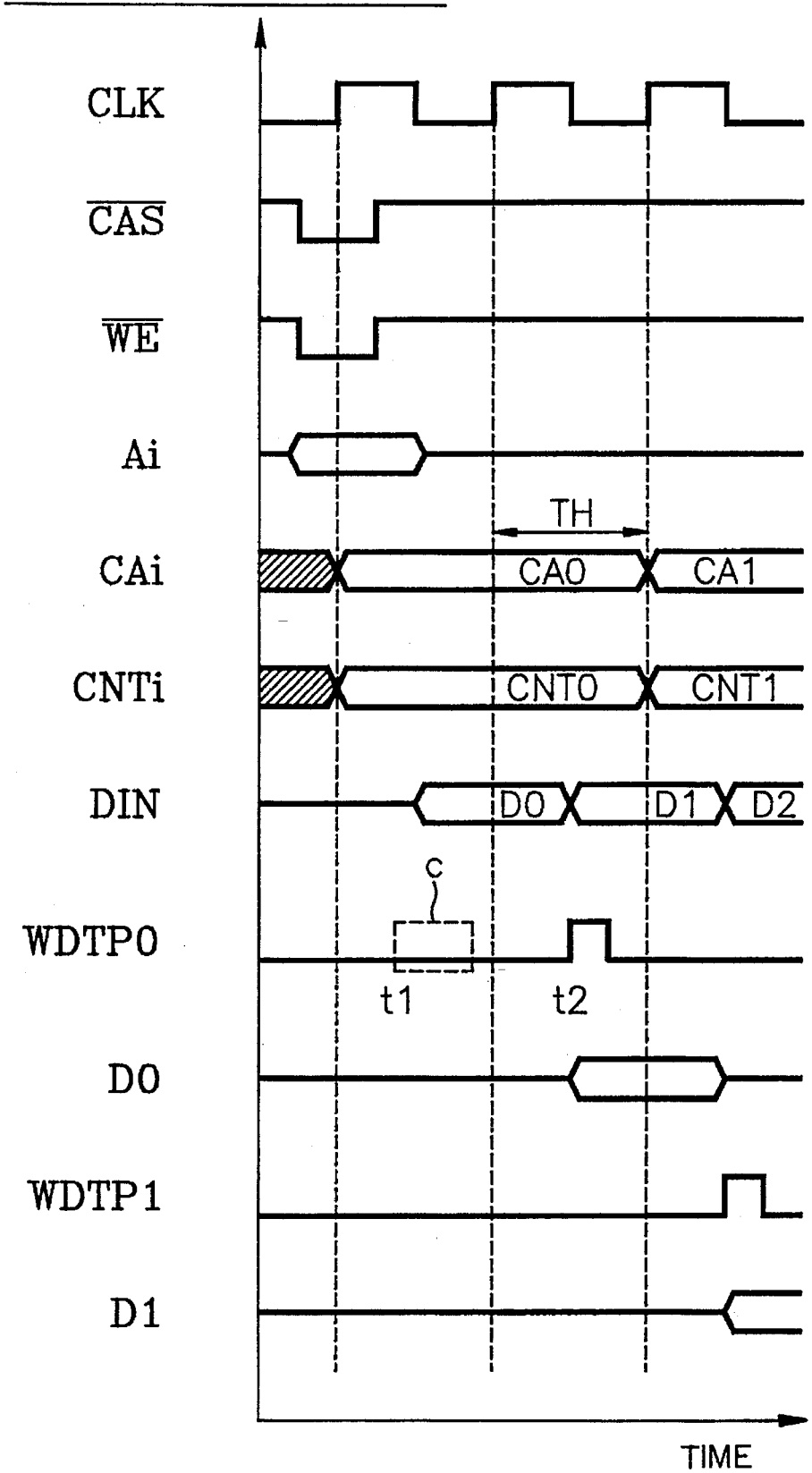
FIG. 10 is a timing chart illustrating the operation of FIG. 1 when the data transfer switching circuit is controlled and the write latency value is "1"

FIG. 9 illustrates a timing chaff when an input/output masking operation is performed by an input/output masking signal DQM under the state that only the data transfer switching circuit 90 of FIG. 1 is not controlled by the write latency information and the write latency value is "1". As shown, the invalid input data D1 is conveyed to the internal data bus by the data transfer switching signal WDTP1 invalidly generated at a time t1. Then the valid data transfer switching signal WDTP1 (indicated in dotted line "a") at a time t2 is not generated by the input/output masking signal DQM activated at a time tM. Therefore, the write input data D1 to be transferred to the internal input bus is not transferred at dotted line "b". However, if the data transfer switching circuit is controlled by the write latency information, as shown in FIG. 10, the data transfer switching signal WDTP1 is generated at not a time t1 as indicated in dotted line "c" but a time t2, thereby normally transferring the input data D1 to the internal data bus.

The operation so far described shows how to implement the present invention to achieve the desired effects.

Figure 11A:
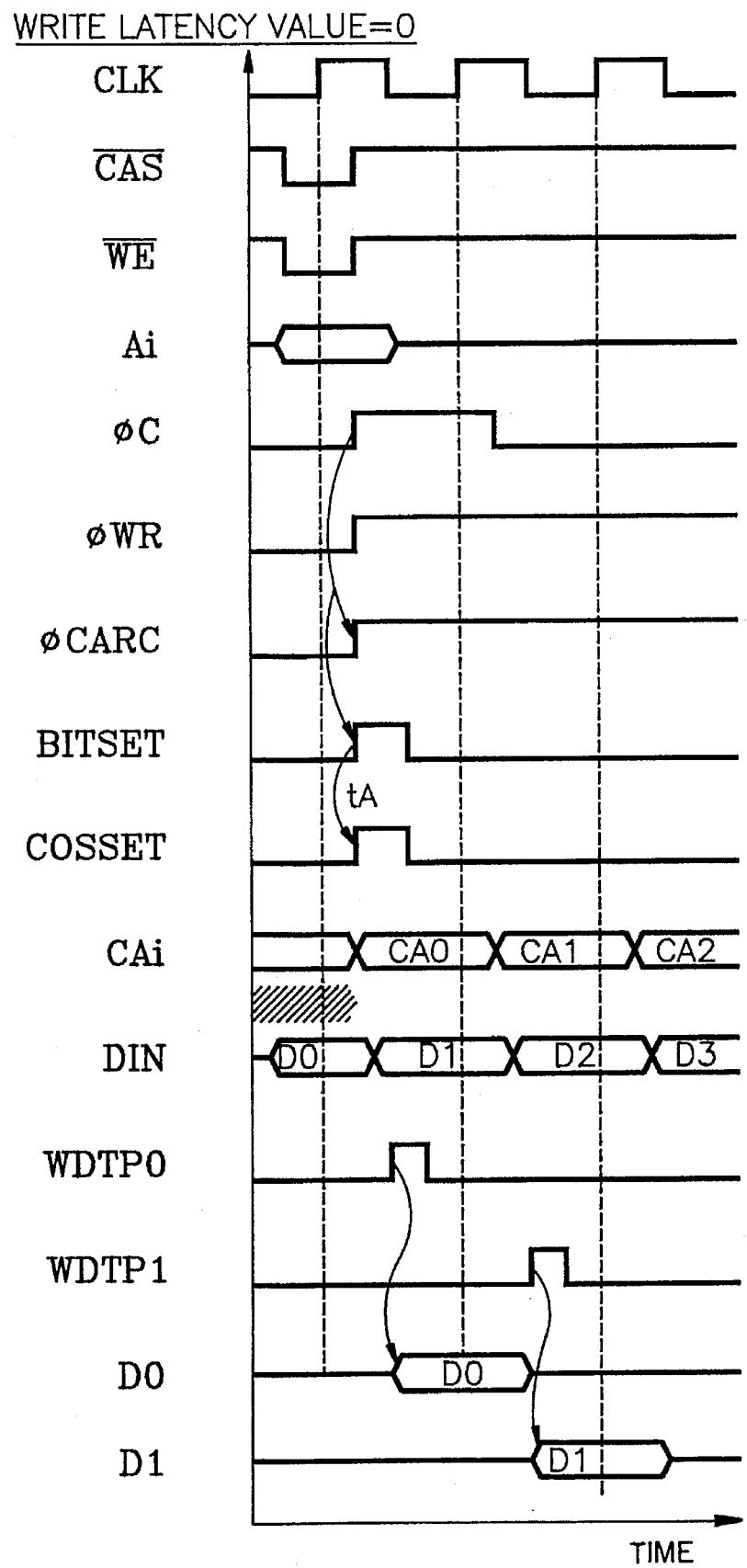
FIGS. 11A and 11B are timing charts illustrating the operation of FIG. 1 according to the present invention when the write latency value is "0" and "1", respectively.
Figure 11B:
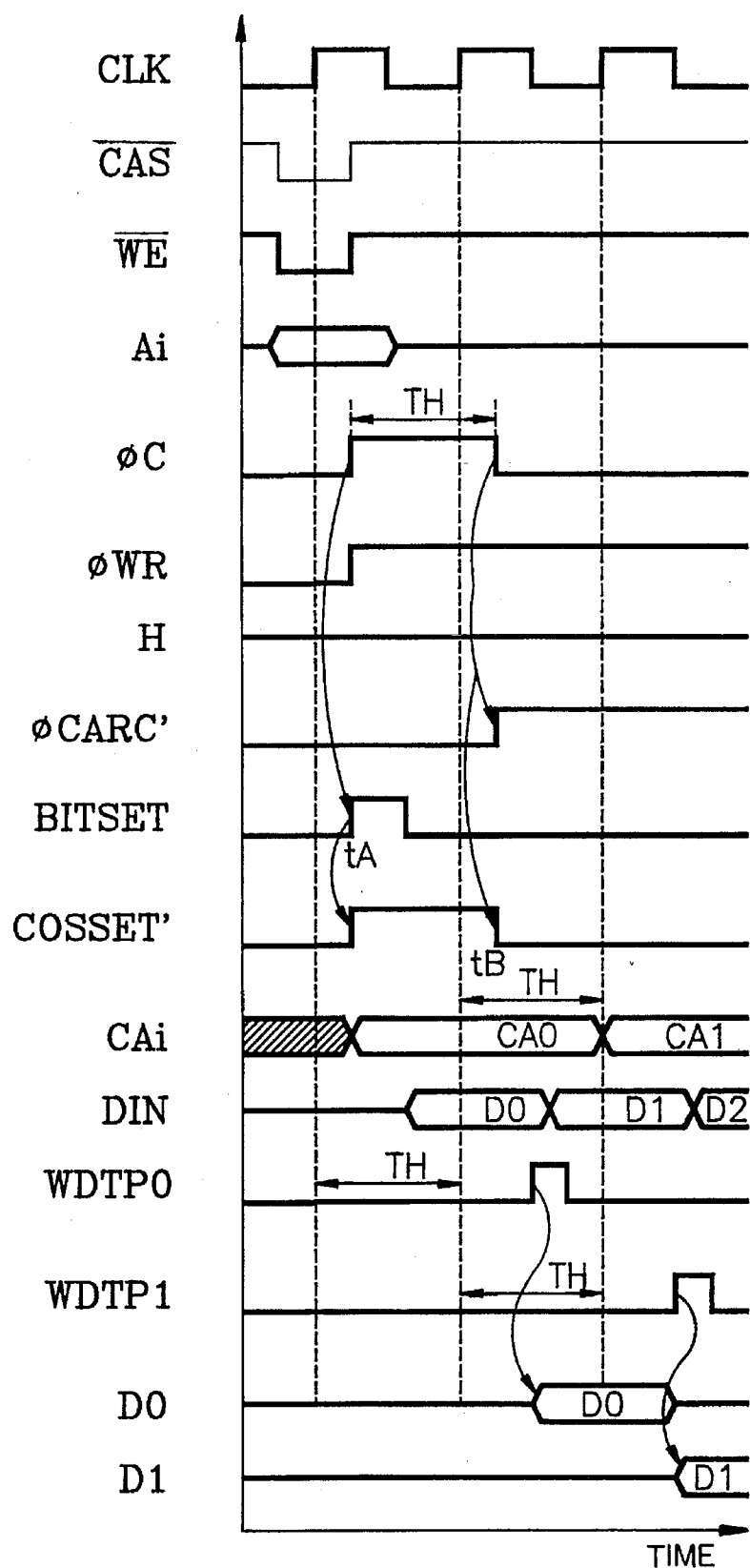

FIGS. 11A and 11B illustrate timing charts embodying the present invention. When the write latency value is "0" (that is, when the write latency signal $\phi$WL1 is logic "low"), the timing chart of FIG. 11A shows the operation performed by FIGS. 4A, 5A, 6 and 7A and is the same as that of FIG. 8A.

As shown in FIG. 11B, when the write latency value is "1" (that is, when the write latency signal $\phi$WL1 is logic "high"), FIGS. 2, 4B, 5B, 6 and 7B are applied. If the bit set signal BITSET is activated by the $\overline{CAS}$ active information signal $\phi$C activated to logic "high", the column address CAi-1 counted at the preceding stage is stored in the latch 42 through the transfer gate 38 in FIG. 4B. Thereafter, the system clock CLK is raised to logic "high" and the transfer gate 43 is turned on, thereby generating the column address signal CAi (CA0). Since the write latency signal $\phi$WL1 is logic "high" (and the $\overline{CAS}$ active information signal $\phi$C and $\overline{WE}$ active information signal $\phi$WR are all logic "high"), the output of the NOR gate 32 controlling the transfer gates 40 and 43 is maintained at logic "low". Hence the column address signal CAi (CA0) is more maintained at the current logic state by the holding time TH while the output of the NOR gate 32 is maintained at logic "low" during the holding time TH. Similarly, in FIG. 5B, since the burst length counting control signal COSSET is maintained at logic "high" during the holding time TH, the burst length counting signal CNTi is maintained at the current logic state. Similarly, in FIG. 7B, since the output of the NAND gate 94 is maintained during the holding time TH at logic "low" by the write latency signal $\phi$WL1 and $\overline{CAS}$ active information signal $\phi$C of logic "high", the data transfer switching signal WDTP0 is delayed by the holding time TH.

After the holding time TH, since the $\overline{CAS}$ active information signal $\phi$C is lowered to logic "low", the column address reset signal $\phi$CARC and burst length counting control signal COSSET are set to logic "high" and "low", respectively. Therefore, in FIG. 4B, the creation of the column address signal CAi (CA0) is completed by the successive trigger-down and trigger-up of the system clock CLK. Similarly, in FIG. 5B, the creation of the burst length counting signal CNTi (CNT0) is completed. In FIG. 7B, since the output of the inverter 93 is logic "high", the NAND gate 94 generates logic "low" in response to the column address signal CAi (CA0) of logic "high" and the trigger-up of the system clock CLK. Then the data transfer switching signal WDTP0 of logic "high" is generated and the corresponding transfer gate TG0 is turned on, thereby transferring the write input data D1 to the internal data bus. The transfer process of the next input data D1 is also similarly implemented.

If the write latency value is set to "n", the $\overline{CAS}$ active information enlarged signal $\phi$CN generated from the circuit of FIG. 3 is used, and the holding time becomes n×TH.

While a particular embodiment of the present invention has been disclosed herewithin, certain changes and modifications will readily occur to those skilled in the art. For example, the circuit of FIG. 3 may be achieved by using other column related signals or write related signals instead of the $\overline{CAS}$ active information signal $\phi$C to generate the write latency value of "n".

As described above, the circuit for controlling the write latency value can be easily achieved. Therefore, the operation of the synchronous semiconductor memory device can be stable and reliability thereof improved.

What is claimed is:

1. A semiconductor memory device including a column address counter, a burst length counter and a data transfer switching circuit for processing data in synchronization with an external system clock, said semiconductor memory device comprising:

means for setting a prescribed write latency value; and means for inhibiting internal operations of said column address counter, burst length counter and data transfer switching circuit for a prescribed holding time corresponding to said write latency value.

2. The semiconductor memory device as set forth in claim 1, wherein said write latency value determines the number of clocks of said system clock counted until input data is transferred to an internal data bus from the activation of an exterior write related control signal.

3. The semiconductor memory device as set forth in claim 1, wherein outputs of said column address counter, burst length counter and data transfer switching circuit are maintained at a current state during said prescribed time.

4. The semiconductor memory device as set forth in claim 1, wherein said write latency value is set using a bonding wire.

5. The semiconductor memory device as set forth in claim 1, wherein said write latency value is set using a fuse.

6. The semiconductor memory device as set forth in claim 1, wherein said write latency value is programmed according to a signal related to an operation mode of said semiconductor memory device.

7. A semiconductor memory device including a column address counter, a burst length counter and a data transfer switching circuit, for processing data in synchronization with an external system clock, said semiconductor memory device comprising:

means for generating a write latency control signal;

means for generating an active information enlarged signal from a plurality of active information signals generated in response to am exterior column related control signal; and means for inhibiting internal operations of said column address counter, burst length counter and data transfer switching circuit for a prescribed holding time during which said active information enlarged signal is in an active state.

8. The semiconductor memory device as set forth in claim 7, wherein said write latency control signal delays exteriorly supplied write input data from being transferred to an internal data bus during said prescribed holding time.

9. The semiconductor memory device as set forth in claim 8, wherein said active information enlarged signal determines the number of clocks of said system clock that are counted until said exteriorly supplied input data is transferred to said internal data bus from activation of an exteriorly supplied write related control signal.

10. The semiconductor memory device as set forth in claim 7, wherein outputs of said column address counter, burst length counter and data transfer switching circuit are maintained at a current state during said prescribed holding time.

11. The semiconductor memory device as set forth in claim 7, wherein each of said plurality of active information signals has a time interval corresponding to one period of said system clock, and said active information enlarged signal is generated by a logical combination of said plurality of active information signals.

12. A semiconductor memory device including a column address counter, a burst length counter and a data transfer switching circuit for processing data in synchronization with an external system clock, said semiconductor memory device comprising:

a programmable circuit which sets a prescribed write latency value; and a hold circuit which inhibiting internal operations of said column address counter, burst length counter and data transfer switching circuit for a prescribed holding time corresponding to said write latency value, said hold circuit including a chain of inverters and connected logic gates.

13. The semiconductor memory device as set forth in claim 1, wherein said write latency value determines the number of clocks of said system clock counted until input data is transferred to an internal data bus from the activation of an exterior write related control signal.

14. The semiconductor memory device as set forth in claim 12, wherein outputs of said column address counter, burst length counter and data transfer switching circuit are maintained at a current state during said prescribed time.

15. The semiconductor memory device as set forth in claim 12, wherein said write latency value is programmed using a bonding wire.

16. The semiconductor memory device as set forth in claim 12, wherein said write latency value is programmed using a fuse.

17. The semiconductor memory device as set forth in claim 12, wherein said write latency value is programmed according to a signal related to an operation mode of said semiconductor memory device.

* * * * *